United States Patent [19]

Lauffer et al.

[11] Patent Number: 4,953,060
[45] Date of Patent: Aug. 28, 1990

[54] STACKABLE INTEGRATED CIRCUIT CHIP PACKAGE WITH IMPROVED HEAT REMOVAL

[75] Inventors: Donald K. Lauffer, San Diego; Ikuo J. Sanwo, San Marcos; Paul M. Rostek, San Diego, all of Calif.

[73] Assignee: NCR Corporation, Dayton, Ohio

[21] Appl. No.: 347,976

[22] Filed: May 5, 1989

[51] Int. Cl.[5] .............................................. H05K 7/20
[52] U.S. Cl. ..................................... 361/388; 357/81; 361/396; 361/401
[58] Field of Search ............... 361/396, 412, 413, 414, 361/401, 383, 384, 386, 387, 388; 357/74, 81; 165/80.3, 185

[56] References Cited

U.S. PATENT DOCUMENTS

| | | | |
|---|---|---|---|
| 3,676,748 | 7/1972 | Kobayashi et al. | 317/101 CM |
| 3,718,750 | 2/1973 | Sayers | 174/94 R |
| 3,999,105 | 12/1976 | Archey et al. | 317/100 |
| 4,103,321 | 7/1978 | Gansert et al. | 361/388 |
| 4,137,559 | 1/1979 | Reuting | 361/331 |
| 4,338,652 | 7/1982 | Romanczuk | 361/388 |
| 4,514,784 | 4/1985 | Williams et al. | 361/386 |
| 4,620,632 | 11/1986 | Alemanni | 206/329 |
| 4,630,172 | 12/1986 | Stenerson et al. | 361/386 |
| 4,654,694 | 3/1987 | Val | 357/74 |
| 4,729,061 | 3/1988 | Brown | 361/386 |

*Primary Examiner*—Gerald P. Tolin
*Attorney, Agent, or Firm*—Wilbert Hawk, Jr.; Stephen F. Jewett; Gregory P. Gadson

[57] ABSTRACT

A pin grid array package for carrying an integrated circuit chip having input/output leads. The pin grid array package includes a carrier having a centrally located opening for carrying the integrated circuit chip, a plurality of input/output pins spaced around the periphery of the centrally located opening, interconnect leads on the carrier for connecting selected ones of the input/output pins to selected leads of the integrated circuit chip, and heat sink material around the periphery of the input/output pins which serves as a cooling-fin for efficient integrated circuit chip heat removal. Each of the plurality of input/output pins is normal to the plane of the integrated circuit chip and extends through the carrier with a first portion extending away from a first side of the carrier and a second portion extending away from a second side of the carrier. The first portion of each input/output pin has a centrally located passage therein, and the second portion has a reduced pin portion for pluggable engagement with a centrally located passage of a similar input/output pin such that the pin grip array package is stackable.

10 Claims, 3 Drawing Sheets

STACKABLE INTEGRATED CIRCUIT CHIP PACKAGE WITH IMPROVED HEAT REMOVAL

BACKGROUND OF THE INVENTION

The present invention relates to carrier packages for integrated circuit chips, and particularly relates to such carrier packages having a grid array of input/output pins which may be interconnected to similar carrier packages.

With the development of high performance computer logic integrated circuit chips having multiple input/output terminals, carrier packages have been developed which use a planar method of interconnection between the input/output terminals of multiple integrated circuit chips. Such packages require large printed circuit board surface areas and long signal conductors, resulting in excessive signal delay and degraded performance. Costly multilayer printed circuit boards have also been developed in order to decrease the surface area and reduce the signal distance for interconnecting multiple integrated circuit chips.

U.S. Pat. No. 3,676,748 to Kobayshi et al. for "Frame Structure for Electronic Circuits", issued July 11, 1972, discloses a frame for holding electronic circuits which may be stacked vertically as shown in FIG. 6. The disclosed frame provides for planar terminal connector members 12 and 14.

U.S. Pat. No. 3,718,750 to Sayers for "Electrical Connector", issued Feb. 27, 1973, discloses an electrical connector having female terminals for connection with electrical leads from printed circuit boards, and a male terminal for connection with the female terminals arranged in a stack.

U.S. Pat. No. 4,137,559 to Reuting for "Socket Assembly", issued Jan. 30, 1979, discloses a plurality of frames which may be stacked in a tube. Each frame may contain a printed circuit board or a large scale integrated circuit chip. The lower frame may be equipped with contact pins which extend from the bottom of that particular socket section.

U.S. Pat. No. 4,514,784 to Williams et al. for "Interconnected Multiple Circuit Module", issued Apr. 30, 1985, discloses an arrangement having connector assemblies for interconnecting two circuit modules. Each circuit module has cooling plates through which interconnecting pins pass for connection into the connector assemblies. The cooling plates have clearance holes through which the interconnecting pins pass so that there is no electrical contact between the pins and the cooling plates.

U.S. Pat. No. 4,620,632 to Alemanni for "Carriers For Pin Grid Array", issued Nov. 4, 1986, discloses an integrated circuit chip carrier having a body with a plurality of pins projecting from at least one face of the body for plugging into a printed circuit board.

SUMMARY OF THE INVENTION

In a specific example of the present invention, a pin grid array package is disclosed for carrying an integrated circuit chip having input/output leads. The pin grid array package includes a carrier having a centrally located opening for carrying the integrated circuit chip, a plurality of input/output pins spaced around the periphery of the centrally located opening, and interconnect leads on the carrier for connecting selected ones of the input/output pins to selected leads of the integrated circuit chip. Each of the plurality of input/output pins are normal to the plane of the integrated circuit chip and extend through the carrier with a first portion extending away from a first side of the carrier and a second portion extending away from a second side of the carrier. The first portion of each input/output pin has a centrally located passage therein, and the second portion has a reduced pin portion for pluggable engagement with a centrally located passage of a similar input/output pin such that the pin grid array package is a stackable. Heat sinking material surrounds the outer edges of the pin grid array, and serves as a novel cooling-fin through which heat can be efficiently removed from the integrated circuit chip by a suitable fluid.

It is an object of the present invention to provide a pin grid array package for an integrated circuit chip in which the input/output pins of one package may plug into the input/output pins of another package such that the integrated circuit chips are stackable, and a cooling-fin around the periphery of each package for efficient heat removal.

It is another object of the present invention to provide a pin grid array package which satisfies the above object and for holding similar integrated circuit chips having input/output pins which, when plugged together, form vertically arranged buses simultaneously providing the same signal to corresponding input/output terminals of the respective integrated circuit chips.

It is another object of the present invention to provide a pin grid array package for holding an integrated circuit chip wherein the cooling-fin includes a metal cooling plate in intimate contact with the integrated circuit chip, the metal cooling plate having holes therethrough, and input/output pins normal to the plane of the integrated circuit chip passing through the holes of the cooling plate such that the input/output pins are electrically insulated from the metal cooling plate.

It is another object of the present invention to provide a pin grid array package for holding an integrated circuit chip and having a metal cooling plate surrounding a plurality of input/output pins normal to the plane of the metal cooling plate and the integrated circuit chip, the input/output pins being pluggable into other input/output pins of another pin grid array package and sized such that when similar pin grid array packages are plugged together, cooling air may move over the metal cooling plates.

These and other objects of the present invention will become apparent from the description of the preferred embodiment and the drawings herein.

DESCRIPTION OF THE PREFERRED EMBODIMENT

Figure 1:
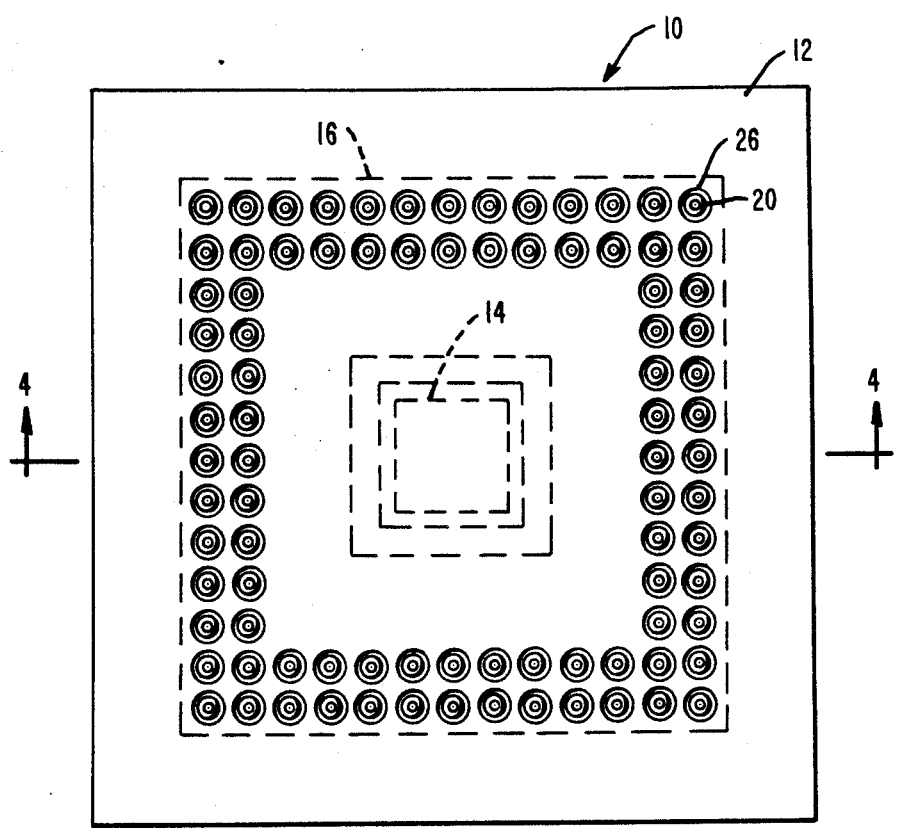
FIG. 1 is a top view of a pin grid array package of the present invention for an integrated circuit chip.
Figure 2:
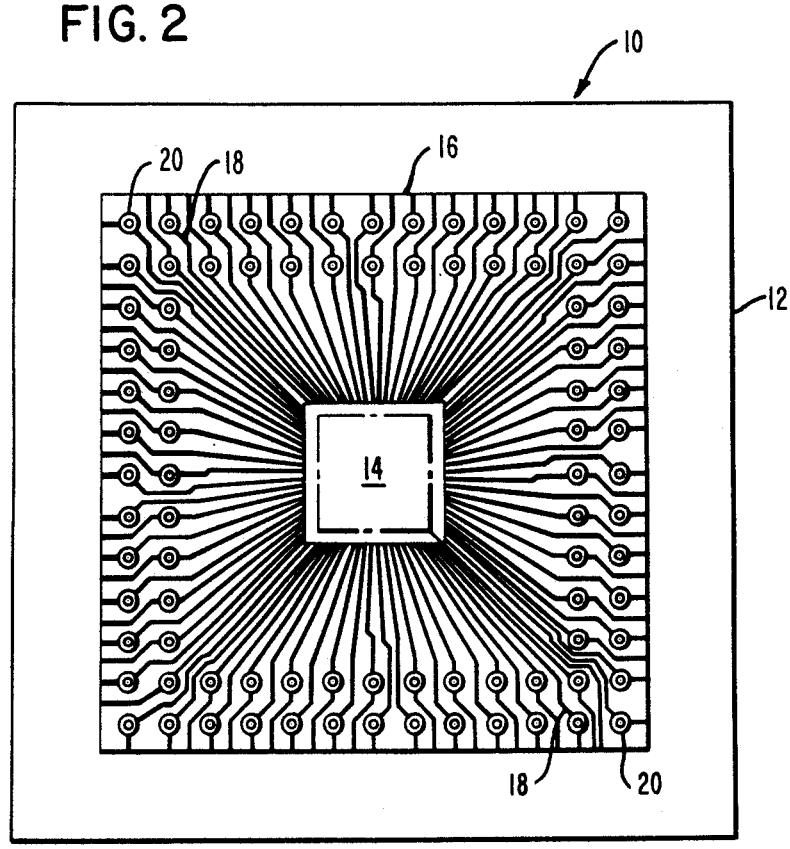
FIG. 2 is a bottom view of the package of FIG. 1 with a bottom member removed exposing a carrier member surrounding the integrated circuit chip.

FIG. 1 is a top view and FIG. 2 is an exposed bottom view of a pin grid array (PGA) package 10 for holding an integrated circuit chip or multiple chips 14. The PGA package 10 includes a heat sink 12 which is a suitable metal plate for carrying away heat generated by the integrated circuit chip 14. The integrated circuit chip 14 (see FIG. 2) is located in the center of the PGA package 10 in intimate contact with the heat sink 12 such that heat generated by the integrated circuit chip 14 is diffused directly into the heat sink 12. A carrier member 16 having a centrally located opening surrounds the integrated circuit chip 14 and includes a plurality of printed conductors 18, leading from the centrally located integrated circuit chip 14 to input/output pins 20.

Figure 3:
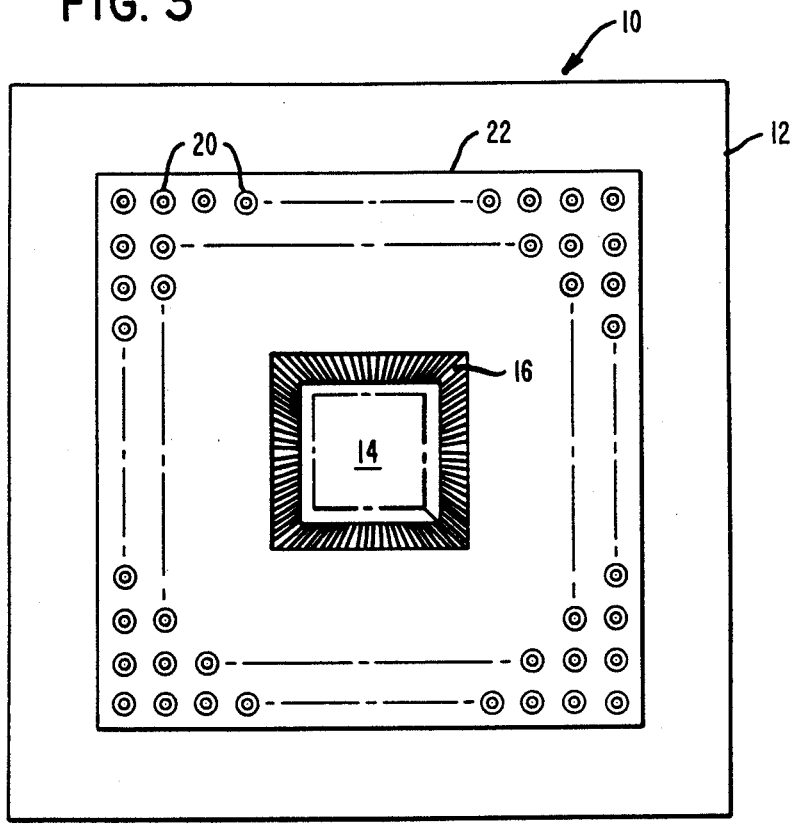
FIG. 3 is a bottom view of the package of FIG. 1 with the bottom member in place.
Figure 4:
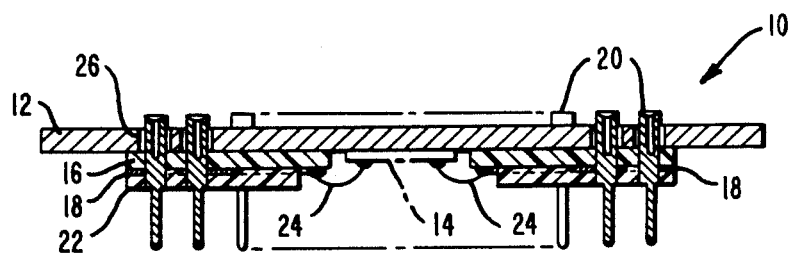
FIG. 4 is a cross-sectional view taken along section line 4—4 of FIG. 1.

FIG. 3 is a bottom view of the complete PGA package 10 including a bottom member 22 which provides re-enforcement for the plurality of pins 20 extending therethrough and insulates the conductors 18 leading from the centrally located integrated circuit chip 14 to the pins 20. FIG. 4 is a cross sectional view of the PGA package 10 taken along section lines 4—4 of FIG. 1. Wire bonds 24 connect individual input/output leads in the integrated circuit chip 14 to selected conductors 18 in the carrier member 16 of the PGA package 10. Thus, electrical connection with a pin 20 will effect electrical connection to a proper lead in the integrated circuit chip 14. Holes 26 are provided through the heat sink 12 through which pass the input/output pins 20. The inside diameter of the holes 26 are larger than the outside diameter of the pins 20 such that the clearance between the two provide for electrical insulation of the pins 20 from the heat sink 12. If desired, a suitable electrical insulating material may be disposed in the holes 26 between the pins 20 and the walls of the holes 26.

Figure 5:
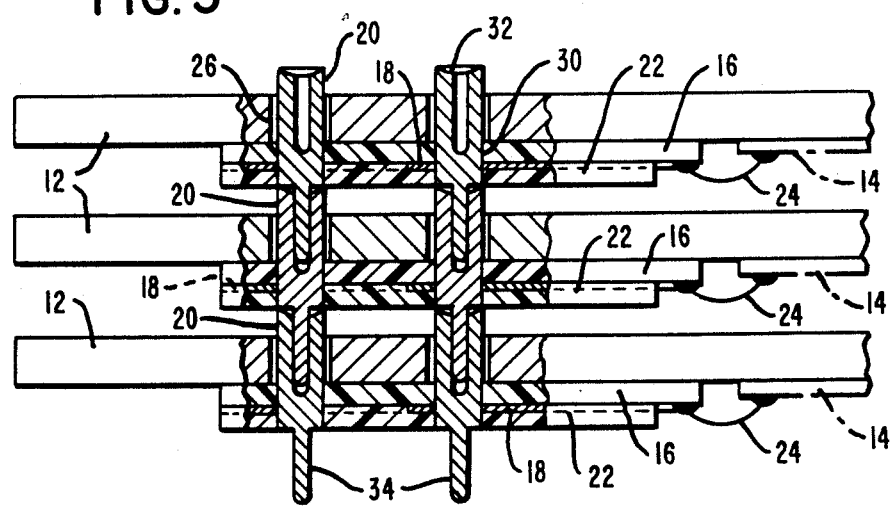
FIG. 5 is a partial cross-sectional view of a stack of three pin grid array packages of FIG. 1.

FIG. 5 is a cross sectional view of three of the PGA packages of FIGS. 1-4 stacked together. The pins 20 have an upper enlarged portion 30 with a centrally located passage 32, and a lower reduced diameter portion 34 sized for an interference fit with the centrally located passage 32. Thus, the PGA packages 10 may be stacked together with the reduced diameter portions 34 of one PGA package fitting into the centrally located passages 32 of the pins 20 of another PGA package 10. In the configuration of FIG. 5, electrical integrity is established between all of the input/output pins 20 which are fitted together as described.

In the arrangement shown in FIGS. 1-3, a total of 88 input/output pin connections are shown. The number of input/output pins may be increased or decreased, as desired. It will be noted that the input/output pins 20 carry completely through the structure when PGA packages are stacked together as shown in FIG. 5. All power supply, ground or major buses may be provided on input/output pins 20 at the same locations of integrated circuit chips of a common family such that common connections for the power supply, ground and input/output buses may be formed by merely stacking similar integrated circuit chips together. Spare pins may be provided to accommodate connections not common to all of the PGA packages stacked. Thus, a compact circuit design is provided having a minimum connection distance between integrated circuit chips resulting in reduced signal delays and improved performance. Layers of other PGA packages (not shown) with pin-to-pin interconnectability can also be included in the stack of FIG. 5 for use in making wiring changes or customizing features. In addition, discrete devices, such as filtering capacitors or termination resistors may be mounted on or in such PGA layers.

The stacked structure of the PGA packages 10 as shown in FIG. 5 also provides for heat sinks 12 located between layers of integrated circuit chips 14. The heat sink material around the periphery of the PGA package 10 (see FIG. 1) allows the heat sink 12 to act as a cooling fin over which air, or other cooling fluid, may be directed to remove heat from the integrated circuit chip 14. Other mechanical cooling means, such as fins or a heat pump may be used. The present PGA package design also provides that the integrated circuit chip 14 be located in contact with the heat sink 12 thus providing for more efficient heat dissipation from the integrated circuit chip 14 to the heat sink 12.

Thus, a package has been described which provides the aforementioned objects. It will be understood by those skilled in the art that the disclosed embodiment is exemplary only, and that various elements disclosed may be replaced by equivalents without departing from the invention hereof, which equivalents are covered by the appended claims.

What is claimed is:

1. A pin grid array package including an integrated circuit chip having input/output leads, said pin grid array package comprising:

carrier means having a centrally located opening carrying the integrated circuit chip;

a plurality of input/output pins in said carrier means and spaced around the periphery of said centrally located opening;

interconnect means on said carrier means connecting selected ones of said input/output pins to selected leads of the integrated circuit chip;

each of said plurality of input/output pins extending through said carrier means with a first portion extending away from a first side of said carrier means and a second portion extending away from a second side of said carrier means, said first portion matable with the second portion of another said pin grid array package and said second portion matable with the first portion of another said pin grid package such that the pin grid array package is stackable with at least another said pin grid array package; and heat sink means, said heat sink means in the form of a cooling-fin on one side of said carrier means having said plurality of input/output pins passing therethrough, said heat sink means extending beyond the periphery of said carrier means, and being in contact with the integrated circuit chip in said centrally located opening for dissipating heat generated by the integrated circuit chip.

2. The pin grid array package of claim 1 wherein said heat sink means is on said first side of said carrier means.

3. The pin grid array package of claim 1 wherein said heat sink has a plurality of holes therethrough, one hole for each input/output pin, each hole being electrically insulated from said input/output pin passing therethrough.

4. The pin grid array package of claim 3 wherein the holes through said heat sink are sized such that their sides are spaced away from and do not contact said input/output pins passing therethrough.

5. The pin grid array package of claim 2 further comprising a cover member on said second side of said carrier means covering at least a portion of said interconnect means and providing electrical insulation therefor.

6. A pin grid array package including an integrated circuit chip having input/output leads, said pin grid array package comprising:

carrier means having a centrally located opening carrying the integrated circuit chip;

a plurality of input/output pins in said carrier means and spaced around the periphery of said centrally located opening;

interconnect means on said carrier means connecting selected ones of said input/output pins to selected leads of the integrated circuit chip;

each of said plurality of input/output pins extending through said carrier means with a first portion extending away from a first side of said carrier means and a second portion extending away from a second side of said carrier means, said first portion having a centrally located passage therein and said second portion having a reduced pin portion for pluggable engagement with a centrally located passage of a similar input/output pin such that the pin grid array package is stackable; and heat sink means, said heat sink means in the form of a cooling-fin on one side of said carrier means having said plurality of input/output pins passing therethrough, said heat sink means extending beyond the periphery of said carrier means, and being in contact with the integrated circuit chip in said centrally located opening for dissipating heat generated by the integrated circuit chip.

7. The pin grid array package of claim 6 wherein said heat sink means is on said first side of said carrier means.

8. The pin grid array package of claim 6 wherein said heat sink has a plurality of holes therethrough, one hole for each input/output pin, each hole being electrically insulated from said input/output pin passing therethrough.

9. The pin grid array package of claim 8 wherein the holes through said heat sink are sized such that their sides are spaced away from and do not contact said input/output pins passing therethrough.

10. The pin grid array package of claim 7 further comprising a cover member on said second side of said carrier means covering at least a portion of said interconnect means and providing electrical insulation therefor.

* * * * *